United States Patent
Pounds et al.

(10) Patent No.: US 9,951,175 B2
(45) Date of Patent: Apr. 24, 2018

(54) METHOD OF FORMING A POLYMER COMPRISING A CONJUGATED BACKBONE

(71) Applicant: Sumitomo Chemical Company Limited, Tokyo (JP)

(72) Inventors: Thomas Pounds, Cambridge (GB); Martin Humphries, Godmanchester (GB); Nazrul Islam, Godmanchester (GB)

(73) Assignee: Sumitomo Chemical Company Limited, Tokyo (JP)

( * ) Notice: Subject to any disclaimer, the term of this patent is extended or adjusted under 35 U.S.C. 154(b) by 22 days.

(21) Appl. No.: 15/129,646

(22) PCT Filed: Mar. 26, 2015

(86) PCT No.: PCT/JP2015/060409
§ 371 (c)(1),
(2) Date: Sep. 27, 2016

(87) PCT Pub. No.: WO2015/147340
PCT Pub. Date: Oct. 1, 2015

(65) Prior Publication Data
US 2017/0174824 A1 Jun. 22, 2017

(30) Foreign Application Priority Data
Mar. 27, 2014 (GB) .................. 1405523.0

(51) Int. Cl.
| | | |
|---|---|---|
| *C08G 61/12* | (2006.01) | |
| *H01L 51/00* | (2006.01) | |
| *C09K 11/06* | (2006.01) | |
| *H01L 51/50* | (2006.01) | |
| *H01L 51/56* | (2006.01) | |

(52) U.S. Cl.
CPC ............ *C08G 61/122* (2013.01); *C09K 11/06* (2013.01); *H01L 51/0039* (2013.01); *H01L 51/0085* (2013.01); *C08G 2261/124* (2013.01); *C08G 2261/144* (2013.01); *C08G 2261/148* (2013.01); *C08G 2261/1424* (2013.01); *C08G 2261/1624* (2013.01); *C08G 2261/1646* (2013.01); *C08G 2261/3142* (2013.01); *C08G 2261/411* (2013.01); *C08G 2261/5242* (2013.01); *C08G 2261/72* (2013.01); *C08G 2261/80* (2013.01); *C08G 2261/95* (2013.01); *C09K 2211/1416* (2013.01); *C09K 2211/1425* (2013.01); *C09K 2211/1466* (2013.01); *C09K 2211/1475* (2013.01); *C09K 2211/185* (2013.01); *H01L 51/5032* (2013.01); *H01L 51/5088* (2013.01); *H01L 51/56* (2013.01)

(58) Field of Classification Search
CPC .............. C08G 61/122; C08G 2261/95; C08G 2261/1424; C08G 2261/144; C08G 2261/148; C08G 2261/1624; C08G 2261/1646; C08G 2261/3142; C08G 2261/5242; C08G 2261/411; C08G 2261/72; C08G 2261/80; C09K 11/06; C09K 2211/1416; C09K 2211/1466; C09K 2211/1425; C09K 2211/185; H01L 51/0085; H01L 51/0039; H01L 51/56; H01L 51/5032; H01L 51/5088
See application file for complete search history.

(56) References Cited

U.S. PATENT DOCUMENTS

| | | |
|---|---|---|
| 2005/0037230 A1 | 2/2005 | Towns et al. |
| 2006/0079648 A1 | 4/2006 | Lutsen et al. |
| 2010/0038597 A1 | 2/2010 | Reynolds et al. |
| 2012/0232239 A1 | 9/2012 | Bazan et al. |

FOREIGN PATENT DOCUMENTS

| | | |
|---|---|---|
| WO | WO 00/53656 A1 | 9/2000 |
| WO | WO 2012/095629 A1 | 7/2012 |
| WO | WO 2013/101902 A1 | 7/2013 |

OTHER PUBLICATIONS

Zhai, L., et al.; Macromolecules, 2003, vol. 36, p. 61-64.*
Yuan, Y., et al.; Journal of Polymer Science Part A: Polymer Chemistry, 2011, vol. 49, p. 225-233.*
Combined Search and Examination Report dated Sep. 26, 2014 for Application No. GB 1405523.0.
International Search Report and Written Opinion dated Jul. 17, 2015 for Application No. PCT/JP2015/060409.
Gu et al., Synthesis and Characterization of a New Triphenylamine-Substituted PFO/PPV Copolymer. Polymer J. 2009;41(10):866-71.
Kwona et al., A new polyfluorene containing repeated ethylenoxy units linked to glycerol as side chains: Synthesis and application as an electron injection material in the fabrication of polymer light-emitting diodes. Synth Metals. Dec. 2012;162(23):2163-70.

* cited by examiner

*Primary Examiner* — Robert Jones, Jr.
(74) *Attorney, Agent, or Firm* — Wolf, Greenfield & Sacks, P.C.

(57) ABSTRACT

A method of forming a polymer comprising a conjugated backbone and side-groups pendant from the conjugated backbone wherein the method comprises the steps of: polymerizing one or more monomers to form a precursor polymer comprising the conjugated backbone and precursor groups pendant from the conjugated backbone, and subsequently converting the precursor groups to the side-groups.

16 Claims, 1 Drawing Sheet

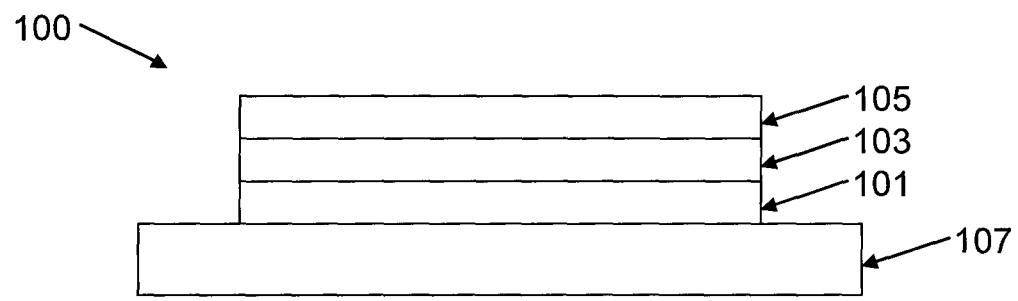

METHOD OF FORMING A POLYMER COMPRISING A CONJUGATED BACKBONE

RELATED APPLICATIONS

This application is a national stage filing under 35 U.S.C. § 371 of international PCT application, PCT/JP2015/060409, filed Mar. 26, 2015, which claims priority to United Kingdom patent application, GB 1405523.0, filed Mar. 27, 2014, each of which is incorporated herein by reference in its entirety.

BACKGROUND

Electronic devices comprising active organic materials are attracting increasing attention for use in devices such as organic light emitting diodes, organic photoresponsive devices (in particular organic photovoltaic devices and organic photosensors), organic transistors and memory array devices. Devices comprising organic materials offer benefits such as low weight, low power consumption and flexibility. Moreover, use of soluble organic materials allows use of solution processing in device manufacture, for example inkjet printing or spin-coating.

An organic light-emitting electrochemical cell (LEC) may have a substrate carrying an anode, a cathode and an organic light-emitting layer between the anode and cathode comprising a light-emitting material, a salt providing mobile ions and an electrolyte, for example a polymer electrolyte ("polyelectrolyte"). LECs are disclosed in, for example, WO 96/00983.

During operation of the device, holes are injected into the device through the anode and electrons are injected through the cathode. Holes in the highest occupied molecular orbital (HOMO) and electrons in the lowest unoccupied molecular orbital (LUMO) of the light-emitting material combine in the light-emitting layer to form an exciton that releases its energy as light. The cations and anions of the salt may respectively p- and n-dope the light-emitting material, which may provide for a low drive voltage.

Suitable light-emitting materials include small molecule, polymeric and dendrimeric materials. Suitable light-emitting polymers for use in the light-emitting layer include poly(arylene vinylenes) such as poly(p-phenylene vinylenes) and polyarylenes such as polyfluorenes. U.S. Pat. No. 5,900,327 discloses a LEC comprising the polymer BDOH-PF:

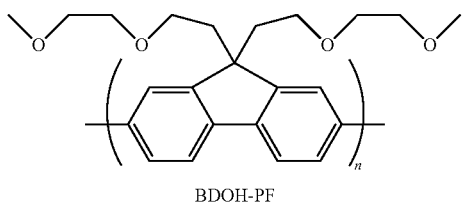

BDOH-PF

The ethylene oxide side groups of BDOH-PF are said to improve compatibility with the ion-conducting polymer poly(ethylene oxide) and increase solubility of the polymer in common organic solvents.

WO 2012/095629 describes polymers comprising polyethylene glycol side-groups pendant from the polymer backbone. The side-groups are introduced into the monomer repeat unit prior to polymerisation.

SUMMARY OF INVENTION

In a first aspect, the invention provides a method of forming a polymer comprising a conjugated backbone and side-groups pendant from the conjugated backbone wherein the method comprises the steps of:
polymerising one or more monomers to form a precursor polymer comprising the conjugated backbone and precursor groups pendant from the conjugated backbone, and
forming the polymer by converting the precursor groups to the side-groups.

Preferably, the backbone comprises arylene or heteroarylene repeat units having side-groups pendant therefrom. More preferably, the backbone comprises fluorene repeat units.

Preferably, the side groups formed by conversion of the precursor groups are each a group of formula $-(OR)_n-R^4$ wherein R in each occurrence is a $C_{1-10}$ alkyl group wherein one or more non-adjacent C atoms may be replaced with O, $R^4$ is H or OH and n is at least 1.

DESCRIPTION OF THE DRAWINGS

The invention will now be described in more detail with reference to the drawings in which:
FIG. 1 illustrates an organic LEC according to an embodiment of the invention.

DETAILED DESCRIPTION OF THE INVENTION

FIG. 1 illustrates an organic LEC 100 according to an embodiment of the invention. The cell 100 has an anode 101, for example ITO, a metal or a conductive organic material such as a polythiophene, for injection of positive charge carriers, a cathode 105 for injection of negative charge carriers and a light-emitting layer 103 between the anode and the cathode. Further layers may be provided between the anode and the cathode, for example a hole-injection layer may be provided between the anode 101 and the light-emitting layer 103. The cell is supported on a substrate 107. If light is emitted through the anode then the substrate 107 is a transparent material, for example glass or a transparent plastic. If light is emitted through the cathode 105 then the substrate 107 may be an opaque or transparent material.

The light-emitting layer contains at least one light emitting material, an electrolyte, optionally a polyelectrolyte, and at least one salt. Polymers as described herein may be provided in the light-emitting layer, and in operation light may be emitted directly from the polymer or the polymer may be used as a host doped with a light-emitting dopant. The light-emitting dopant may be a fluorescent dopant that accepts singlet excitons from the polymer wherein fluorescence is produced by radiative decay of singlet excitons, or a phosphorescent dopant that accepts triplet excitons, and optionally singlet excitons, from the light-emitting polymer and emits light by radiative decay of triplet excitons. If a light-emitting dopant is present then all light may be emitted by the dopant, or both the polymer and the light-emitting dopant may emit light. More than one light-emitting dopant may be present. Light-emission from multiple light-emitting materials (either polymers or dopants) may combine to produce white light.

The light-emitting layer may have a thickness in the range of about 100 nm-2 microns, preferably 100 nm-1 micron; preferably 100 nm-750 nm, preferably 100-500 nm.

The light-emitting layer 103 illustrated in FIG. 1 is a film that extends across the whole of the surface area of the anode 101 and cathode 105, however in other embodiments the light-emitting layer 103 may comprise two or more separate light-emitting films. The light-emitting film or films of a light-emitting layer may have a width of up to about 10 cm, optionally up to about 5 cm, optionally up to about 2 cm, optionally up to about 1 cm, or optionally up to about 5 mm. The light-emitting film or films may have a width of at least 0.5 mm.

The anode and/or cathode may be patterned to define pixels of a light-emitting display.

Polymerisation Method

The present invention provides a method for the introduction of pendant side-groups into a conjugated polymer after polymerisation.

The method of the present invention uses a monomer substituted with one or more precursor groups. The precursor groups present in the monomer are stable to polymerisation conditions and remain unchanged during a polymerisation step. The monomer is polymerised, optionally with one or more other monomers with or without precursor groups, to provide a precursor polymer. The precursor polymer comprises a conjugated backbone and precursor groups pendant from the backbone. The polymer is subsequently formed by converting the precursor groups within the precursor polymer into side-groups.

As used herein "conjugated backbone" means that there is a conjugation path extending across a plurality of aromatic or heteroaromatic groups in the polymer backbone. The aromatic or heteroaromatic groups may be directly linked by a single bond or may be linked by double or triple bonds in the polymer backbone. The polymer backbone may contain breaks in conjugation along the backbone, for example, the polymer backbone may comprise a non-conjugating group such as an alkylene chain breaking conjugation between aromatic or heteroaromatic groups on either side of the non-conjugating group.

The conjugated backbone is suitably formed by a polymerisation reaction in which carbon-carbon bonds are formed between aromatic or heteroaromatic groups of monomers.

"Aromatic group", "heteroaromatic group", "aromatic repeat unit" and "heteroaromatic repeat unit" as used herein includes monocyclic aromatic and heteroaromatic ring systems and polycyclic, including fused, aromatic and heteroaromatics.

The method of the present invention enables the introduction of side-groups along the polymer chain and allows the degree of incorporation of the side-groups to be varied. The method also enables the introduction of side-groups that would not tolerate the reaction conditions used during polymerisation. The method of the present invention also enables a large number of different polymers to be made from a single precursor polymer by variation of the side-groups.

The polystyrene-equivalent number-average molecular weight (Mn) measured by gel permeation chromatography of the polymers described herein may be in the range of about $1\times10^3$ to $1\times10^8$, and preferably $1\times10^4$ to $5\times10^6$. The polystyrene-equivalent weight-average molecular weight (Mw) of the polymers described herein may be $1\times10^3$ to $1\times10^8$, and preferably $1\times10^4$ to $1\times10^7$.

Repeat Units

One or more arylene or heteroarylene repeat units in the polymer backbone are substituted with one or more side groups formed by a process of the invention. All side groups of the polymer may be formed by a process of the invention, or one or more repeat units of the polymer may have side groups that are not changed by the process of the invention.

One class of arylene repeat units is phenylene repeat units, such as phenylene repeat units of formula (III):

(III)

wherein p in each occurrence is independently 0, 1, 2, 3 or 4, optionally 1 or 2; n is 1, 2 or 3; and $R^1$ independently in each occurrence is a substituent.

Where present, each $R^1$ may independently be selected from the group consisting of:

alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;

aryl and heteroaryl groups that may be unsubstituted or substituted with one or more substituents, preferably phenyl substituted with one or more $C_{1-20}$ alkyl groups; and a linear or branched chain of aryl or heteroaryl groups, each of which groups may independently be substituted, for example a group of formula —$(Ar^3)_r$ wherein each $Ar^3$ is independently an aryl or heteroaryl group and r is at least 2, preferably a branched or linear chain of phenyl groups each of which may be unsubstituted or substituted with one or more $C_{1-20}$ alkyl groups.

Substituted N, where present, may be —$NR^2$— wherein $R^2$ is $C_{1-20}$ alkyl; unsubstituted phenyl; or phenyl substituted with one or more $C_{1-20}$ alkyl groups.

Preferably, each $R^1$ is independently selected from $C_{1-40}$ hydrocarbyl wherein one or more non-aromatic C atoms in a chain of the hydrocarbyl group may be replaced with O, and is more preferably selected from $C_{1-20}$ alkyl wherein one or more non-adjacent C atoms may be replaced with O; unsubstituted phenyl; and phenyl substituted with one or more $C_{1-20}$ alkyl groups wherein one or more non-adjacent C atoms of the alkyl group or groups may be replaced with O.

One or more substituents $R^1$ may be polar substituents. Polar substituents $R^1$ may improve compatibility of the light-emitting polymer with polymer electrolytes such as polyethylene oxide.

Where present, $R^1$ may be a side-group formed by the process of the present invention.

In one embodiment, p is at least 1 and at least one group $R^1$ is a side-group of formula —$(OR)_n$—$R^4$ wherein R in each occurrence is a $C_{1-10}$ alkyl group wherein one or more non-adjacent C atoms may be replaced with O, $R^4$ is H or OH and n is at least 1, optionally 1-10. Preferably, n is at least 4. More preferably, n is 5 to 10.

Exemplary groups —$(OR)_n$—$R^4$ include oligo-ether groups, for example a group of formula —$(OCH_2CH_2)_n$—$R^4$ wherein n is at least 1, optionally 1-10. Preferably, n is at least 4. More preferably, n is 5 to 10. If $R^1$ is an oligomeric group then individual occurrences of a repeat unit of formula (III) may have different length oligomeric substituents $R^1$.

The polymer may include repeat units of formula (III) wherein one or more groups $R^1$ are formed by a process of the invention, and/or repeat units of formula (III) wherein one or more groups $R^1$ do not change during the process of the invention.

The repeat unit of formula (III) may have one or more substituents $R^1$ adjacent to a linking position of the repeat unit, and optionally may have at least on substituent adjacent to each linking position of the repeat unit. Steric hindrance between any such substituents and an adjacent repeat unit can be used to create a twist between the two repeat units which limits the extent of conjugation between the repeat units in the polymer backbone without breaking the conjugation between the repeat units. Suitable substituents R1 for creating steric hindrance include $C_{1-20}$ alkyl in which one or more non-adjacent C atoms of the alkyl group or group may be replaced with O.

A particularly preferred class of arylene repeat units is optionally substituted fluorene repeat units, such as repeat units of formula (IV):

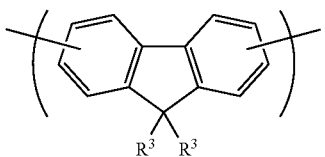

(IV)

wherein $R^3$ in each occurrence is the same or different and is H or a substituent, and wherein the two groups $R^3$ may be linked to form a ring.

If $R^3$ is a substituent then it is preferably selected from substituents $R^1$ described with reference to formula (III).

The polymer may include repeat units of formula (III) wherein one or both groups $R^3$ are formed by a process of the invention, and/or repeat units of formula (III) wherein one or more groups $R^3$ do not change during the process of the invention The aromatic carbon atoms of the fluorene repeat unit may be unsubstituted, or may be substituted with one or more substituents. Exemplary substituents are alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Substituted N, where present, may be —$NR^2$— wherein $R^2$ is $C_{1-20}$ alkyl; unsubstituted phenyl; or phenyl substituted with one or more $C_{1-20}$ alkyl groups.

The repeat unit of formula (IV) may be a 2,7-linked repeat unit of formula (IVa):

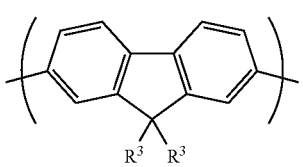

(IVa)

To maximize conjugation across the repeat unit of formula (IVa), the repeat unit may not substituted in a position adjacent to the 2- or 7-positions.

The extent of conjugation across repeat units of formulae (IV) may be limited by (a) linking the repeat unit through the 3- and/or 6-positions to limit the extent of conjugation across the repeat unit, and/or (b) substituting the repeat unit with one or more further substituents $R^1$ in or more positions adjacent to the linking positions in order to create a twist with the adjacent repeat unit or units, for example a 2,7-linked fluorene carrying a $C_{1-20}$ alkyl substituent in one or both of the 3- and 6-positions. The polymer may contain amine repeat units in particular amines of formula (V):

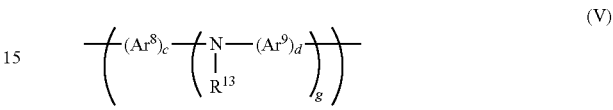

(V)

wherein $Ar^8$ and $Ar^9$ in each occurrence are independently selected from substituted or unsubstituted aryl or heteroaryl, g is greater than or equal to 1, preferably 1 or 2, $R^{13}$ is H or a substituent, preferably a substituent, and c and d are each independently 1, 2 or 3.

$R^{13}$, which may be the same or different in each occurrence when g>1, is preferably selected from the group consisting of alkyl, for example $C_{1-20}$ alkyl, $Ar^{10}$, or a branched or linear chain of $Ar^{10}$ groups, wherein $Ar^{10}$ in each occurrence is independently optionally substituted aryl or heteroaryl. Exemplary groups $R^{13}$ are $C_{1-20}$ alkyl, phenyl and phenyl substituted with one or more $C_{1-20}$ alkyl groups.

Each $R^{13}$ may comprise a side-group formed by the process of the present invention. In one embodiment, $R^{13}$ comprises a side-group of formula —$(OR)_n$—$R^4$ as described with respect to formula (III). $R^{13}$ may be a phenyl group substituted with one or more side-groups of formula —$(OR)_n$—$R^4$.

Any of $Ar^8$, $Ar^9$ and, if present, $Ar^{10}$ bound directly to a N atom in the repeat unit of formula (V) may be linked by a direct bond or a divalent linking atom or group to another of $Ar^8$, $Ar^9$ and $Ar^{10}$ bound directly to the same N atom. Preferred divalent linking atoms and groups include O, S; substituted N; and substituted C.

Any of $Ar^8$, $Ar^9$ and, if present, $Ar^{10}$ may be substituted with one or more substituents. Exemplary substituents are substituents $R^{14}$, wherein each $R^{14}$ may independently be selected from the group consisting of substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F.

Substituted N or substituted C, where present, may be N or C substituted with a hydrocarbyl group (in the case of substituted N) or two hydrocarbyl groups (in the case of substituted C), for example a $C_{1-10}$ alkyl, unsubstituted phenyl or phenyl substituted with one or more $C_{1-10}$ alkyl groups.

Preferred repeat units of formula (V) have formulae 1-3:

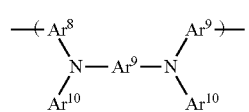

1

-continued

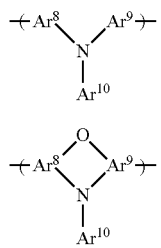

2

3

In one preferred arrangement, $R^{13}$ is $Ar^{10}$ and each of $Ar^8$, $Ar^9$ and $Ar^{10}$ are independently unsubstituted or substituted with one or more $C_{1-20}$ alkyl groups.

$Ar^8$, $Ar^9$ and $Ar^{10}$ are preferably phenyl, each of which may independently be substituted with one or more substituents as described above.

In another preferred arrangement, $Ar^8$ and $Ar^9$ are phenyl, each of which may be substituted with one or more $C_{1-20}$ alkyl groups, and $R^{13}$ is 3,5-diphenylbenzene wherein each phenyl may be substituted with one or more $C_{1-20}$ alkyl groups.

In another preferred arrangement, c, d and g are each 1 and $Ar^8$ and $Ar^9$ are phenyl linked by an oxygen atom to form a phenoxazine ring.

Exemplary amine repeat units include a blue light-emitting repeat unit of formula (Va):

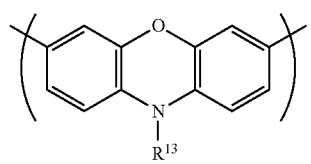

(Va)

$R^{13}$ of formula (Va) is preferably a hydrocarbyl, preferably $C_{1-20}$ alkyl, phenyl that is unsubstituted or substituted with one or more $C_{1-20}$ alkyl groups, or a branched or linear chain of phenyl groups wherein each said phenyl group is unsubstituted or substituted with one or more $C_{1-20}$ alkyl groups.

Amine repeat units may be provided in a molar amount in the range of about 0.5 mol % up to about 50 mol %, optionally up to 40 mol %. The light-emitting polymer may comprise conjugation-breaking repeat units that break any conjugation path between repeat units adjacent to the conjugation-breaking repeat unit. An exemplary conjugation-breaking repeat unit has formula (VI):

—(Ar⁴-Sp¹-Ar⁴)— (VI)

wherein $Ar^4$ in each occurrence independently represents a substituted or unsubstituted aryl or heteroaryl group; $Sp^1$ represents a spacer group that does not provide any conjugation path between the two groups $Ar^4$. $Ar^4$ is preferably phenyl that may be unsubstituted or substituted with one or more substituents, preferably one or more $C_{1-20}$ alkyl groups wherein one or more non-adjacent C atoms of the $C_{1-20}$ alkyl group may be replaced with O.

$Sp^1$ may contain a single non-conjugating atom only between the two groups $Ar^4$, or $Sp^1$ may contain non-conjugating chain of at least 2 atoms separating the two groups $Ar^4$.

Preferably, the non-conjugating atom or chain includes at least one group of formula $—CR^7{}_2—$ or $—SiR^7{}_2—$ wherein $R^7$ in each occurrence is H or a substituent, optionally $C_{1-20}$ alkyl.

A spacer chain $Sp^1$ may contain two or more atoms separating the two groups $Ar^4$, for example a $C_{1-20}$ alkyl chain wherein one or more non-adjacent C atoms of the chain may be replaced with O or S.

Preferred groups $Sp^1$ are selected from $C_{1-20}$ alkyl wherein one or more non-adjacent C atoms may be replaced with O. An ether spacer or oligo-ether spacer chain, for example a chain of formula $—(CH_2CH_2O)_v—$, wherein v is 1 or more, optionally 1-10, may improve miscibility of the semiconducting polymer with electrolytes such as poly(ethylene oxide). Preferably, v is at least 4. More preferably, v is 5 to 10.

Examples of cyclic non-conjugating spacers are optionally substituted cyclohexane or adamantane repeat units that may have the structures illustrated below:

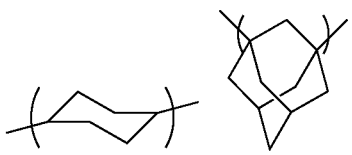

Exemplary substituents for cyclic conjugation repeat units include $C_{1-10}$ alkyl. Where present, conjugation breaking repeat units may make up 0.5-30 mol % of repeat units of the polymer, preferably 1-20 mol % of repeat units.

Side-Groups

In one embodiment, the side-group is a group of formula $—(OR)_nR^4$ wherein R in each occurrence is a $C_{1-10}$ alkyl group, optionally a $C_{1-5}$ alkyl group, wherein one or more non-adjacent C atoms may be replaced with O, $R^4$ is H or OH and n is at least 1, optionally 1-10. Preferably, n is at least 4. More preferably, n is 5 to 10. The value of n may be the same in all the polymer side-groups of formula $—(OR)_n—R^4$. Alternatively, the value of n may be different within one or more of the polymer side-groups.

Preferably the side-group is a polyethylene glycol (PEG) group of formula $—(OCH_2CH_2)_nOH$ wherein n is at least 1, optionally 1-10. Preferably, n is at least 4. More preferably, n is 5 to 10.

Incorporation of a PEG side-group into the polymer may improve miscibility of the polymer with electrolytes such as poly(ethylene oxide).

The present inventors have found that monomers comprising oligomeric side-groups, for example PEG side groups, can be difficult to handle during polymerisation. In particular, said monomers do not have a clearly defined molecular weight and as a result it is difficult to accurately obtain an exact monomer stoichiometry for polymerisation. The method of the present invention overcomes this problem by enabling incorporation of oligomeric side-groups after the polymerisation step.

In one embodiment the side-group is an oligomer. The oligomer chain lengths may be the same in all the polymer side-groups. Alternatively, the oligomer chain lengths may be different within one or more of the polymer side-groups.

Any side-group may be directly bound to the backbone of the polymer or spaced apart therefrom by a spacer group, for example a $C_{1-20}$ alkyl spacer group in which one or more non-adjacent C atoms may be replaced by O or S or C=O or C(=O)O.

Precursor Groups

In one embodiment, the precursor group is a group of formula —O-PROT wherein PROT is a protecting group. As used herein PROT is any suitable protecting group that is stable under polymerization conditions for example silyl groups. Exemplary silyl groups include trimethylsilyl, triethylsilyl, triisopropylsilyl, dimethylisopropylsilyl, diethylisopropylsilyl, dimethylthexylsilyl, t-butyldimethylsilyl, t-butyldiphenylsilyl, tribenzylsilyl, tri-p-xylylsilyl, triphenylsilyl, diphenylmethylsilyl, and t-butylmethoxyphenylsilyl. Preferred silyl groups include triisopropylsilyl, t-butyldimethylsilyl, t-butyldiphenylsilyl and triphenylsilyl.

The precursor groups can be converted into the side-groups by any means known in the art. Typically, where the precursor group is a group of formula —O-PROT, the protecting group is removed to provide an OH group. The OH group so produced is then converted into a side-group.

The precursor polymer may also comprise side-groups that do not change during conversion of the precursor groups.

Polymer Synthesis

In one embodiment, the polymerisation is a metal-catalysed polymerisation of one or more monomers in which C—C bonds are formed between aromatic or heteroaromatic groups of the monomers to form the conjugated backbone of the polymer, and the one or more monomers comprise a monomer of formula (I):

LG-RU$^1$-LG (I)

wherein RU$^1$ is a group comprising one or more aromatic or heteroaromatic groups; each LG is a leaving group bound to an aromatic carbon atom of RU$^1$; and RU$^1$ is substituted with one or more precursor groups.

RU$^1$ may be an aromatic or heteroaromatic group Ar$^1$ substituted with one or more precursor groups, for example a repeat unit of formula (III) or (IV).

RU$^1$ may be an arylamine group of formula (V) or a conjugation-breaking group of formula (VI).

RU$^1$ may be substituted only with the one or more precursor groups, or Ar$^1$ may be substituted with one or more substituents that do not change during conversion of the precursor groups.

The polymer may be a homopolymer formed by polymerizing monomers of formula (I) followed by conversion of the precursor groups.

The polymer may be a copolymer comprising repeat units of formula RU$^1$ and one or more further repeat units. The one or more further repeat units may each have formula (II):

LG-RU$^2$-LG (II)

wherein RU$^2$ is a group comprising one or more aromatic or heteroaromatic groups; each LG is a leaving group bound to an aromatic carbon atom of RU$^2$; and RU$^2$ is unsubstituted or substituted with one or more substituents.

If RU$^2$ is substituted then RU$^2$ may be substituted only with one or more precursor groups; only with one or more groups that do not change during conversion of the precursor groups; or with at least one precursor group and at least one group that does not change during conversion of the precursor groups.

RU$^2$ may be an aromatic or heteroaromatic group Ar$^2$ substituted with one or more precursor groups, for example a repeat unit of formula (III) or (IV).

RU$^2$ may be an arylamine group of formula (V) or a conjugation-breaking group of formula (VI).

Substituents of RU$^1$ or RU$^2$ that do not change during conversion of the precursor groups are preferably selected from $C_{1-40}$ hydrocarbyl wherein one or more non-aromatic C atoms in a chain of the hydrocarbyl group may be replaced with O, and are more preferably selected from $C_{1-20}$ alkyl wherein one or more non-adjacent C atoms may be replaced with O; unsubstituted phenyl; and phenyl substituted with one or more $C_{1-20}$ alkyl groups wherein one or more non-adjacent C atoms of the alkyl group or groups may be replaced with O.

Preferably, LG in each occurrence is independently selected from boronic acid, boronic acid ester and halogen. Preferably, the halogen is bromine or iodine.

The repeat units illustrated throughout this application may be derived from a monomer carrying suitable leaving groups. Preferably, repeat units derived from the monomer of formula (I) comprises up to 50 mol % of the precursor polymer. More preferably, repeat units derived from the monomer of formula (I) comprises between 10 and 40 mol % of the precursor polymer.

The conjugated backbone may be formed by polymerisation reactions in which C—C single bonds are formed between aromatic or heteroaromatic groups. One method of forming conjugated polymers is Suzuki polymerisation, for example as described in WO 00/53656 or U.S. Pat. No. 5,777,070 which allows formation of C—C bonds between two aromatic or heteroaromatic groups, and so enables formation of polymers having conjugation extending across two or more repeat units. Suzuki polymerisation takes place in the presence of a palladium complex catalyst and a base.

As illustrated in Scheme 1, in the Suzuki polymerisation process a monomer for forming repeat units RU1 having leaving groups LG1 such as boronic acid or boronic ester groups undergoes polymerisation with a monomer for forming repeat units RU2 having leaving groups LG2 such as halogen, optionally bromine or iodine; sulfonic acid; or sulfonic ester to form a carbon-carbon bond between aromatic carbon atoms of RU1 and RU2:

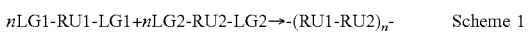

$n$LG1-RU1-LG1+$n$LG2-RU2-LG2→-(RU1-RU2)$_n$- Scheme 1

Exemplary boronic esters have formula (VI):

(VI)

wherein R$^6$ in each occurrence is independently a $C_{1-20}$ alkyl group, * represents the point of attachment of the boronic ester to an aromatic ring of the monomer, and the two groups R$^6$ may be linked to form a ring. In a preferred embodiment, the two groups R$^6$ are linked to form the pinacol ester of boronic acid:

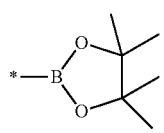 [SMILES: *B1OC(C)(C)C(C)(C)O1]

It will be understood by the skilled person that a monomer LG1-RU1-LG1 will not polymerise to form a direct carbon-carbon bond with another monomer LG1-RU1-LG1. A monomer LG2-RU2-LG2 will not polymerise to form a direct carbon-carbon bond with another monomer LG2-RU2-LG2.

Preferably, one of LG1 and LG2 is bromine or iodine and the other is a boronic acid or boronic ester.

This selectivity means that the ordering of repeat units in the polymer backbone can be controlled such that all or substantially all RU1 repeat units formed by polymerisation of LG1-RU1-LG1 are adjacent, on both sides, to RU2 repeat units.

In the example of Scheme 1 above, an AB copolymer is formed by copolymerisation of two monomers in a 1:1 ratio, however it will be appreciated that more than two or more than two monomers may be used in the polymerisation, and any ratio of monomers may be used. The base may be an organic or inorganic base. Exemplary organic bases include tetra-alkylammonium hydroxides, carbonates and bicarbonates. Exemplary inorganic bases include metal (for example alkali or alkali earth) hydroxides, carbonates and bicarbonates.

The palladium complex catalyst may be a palladium (0) or palladium (II) compound.

Particularly preferred catalysts are tetrakis(triphenylphosphine)palladium (0) and palladium (II) acetate mixed with a phosphine.

A phosphine may be provided, either as a ligand of the palladium compound catalyst or as a separate compound added to the polymerisation mixture. Exemplary phosphines include triarylphosphines, for example triphenylphosphines wherein each phenyl may independently be unsubstituted or substituted with one or more substituents, for example one or more $C_{1-5}$ alkyl or $C_{1-5}$ alkoxy groups.

Particularly preferred are triphenylphospine and tris(ortho-methoxytriphenyl) phospine.

The polymerisation reaction may take place in a single organic liquid phase in which all components of the reaction mixture are soluble.

The reaction may take place in a two-phase aqueous-organic system, in which case a phase transfer agent may be used. The reaction may take place in an emulsion formed by mixing a two-phase aqueous-organic system with an emulsifier.

Another polymerisation method is Yamamoto polymerisation in which all groups LG are halogens and which takes place in the presence of a Ni catalyst.

The polymer may be end-capped by addition of an endcapping reactant. Suitable end-capping reactants are aromatic or heteroaromatic materials substituted with only one leaving group. In the case of Suzuki polymerisation, the end-capping reactants may include reactants substituted with a halogen for reaction with a boronic acid or boronic ester group at a polymer chain end, and reactants substituted with a boronic acid or boronic ester for reaction with a halogen at a polymer chain end. Exemplary end-capping reactants are halobenzenes, for example bromobenzene, and phenylboronic acid. In the case of Yamamoto polymerisation, the end-capping reactants may include reactants substituted with a halogen for reaction with a halogen group at a polymer chain end. End-capping reactants may be added during or at the end of the polymerisation reaction.

Electrolyte

The electrolyte is preferably a polymer electrolyte. Exemplary polymer electrolytes include: polyalkylene oxides, for example polyethylene oxide (PEO) and polypropylene oxides; copolymers of alkylene oxide, for example polyethylene-block (ethylene glycol) polymer and poly(ethylene glycol)-block-poly(propylene glycol)-block poly(ethylene glycol) polymer; esters of polyalkyleneglycols such as polycarbonates; polyolefins; and polysiloxanes.

A polyalkylene oxide polymer electrolyte may carry hydroxyl end-capping groups.

The light-emitting material or materials of the composition may make up at least 50 weight % of the composition, and may form up to 80 or 90 weight % of the composition. In the case of a host/dopant system, the weight of the light-emitting materials includes the weight of the host material.

The weight percentages of components of the composition provided herein are the weight percentages of the components of the light-emitting layer following evaporation of the solvent(s).

Salts

Salts with relatively small anions or cations may be more mobile than salts with bulkier ions.

Preferred cations of the salt include alkali, alkali earth and ammonium cations. Ammonium cations include $NH_4^+$ cations and mono-, di-tri and tetraalkylammonium cations.

Preferred anions of the salt include halogen-containing anions, in particular fluorine-containing anions, for example hexafluorophosphate and tetrafluoroborate.

The light-emitting composition may include only one salt or more than one salt. The ionic salt or salts may be provided in an amount in the range 0.1-25% by weight, optionally 1-15% by weight, of the composition.

Phosphorescent Light-Emitting Materials

Exemplary phosphorescent light-emitting materials include metal complexes comprising substituted or unsubstituted complexes of formula (VII):

$$ML^1_q L^2_r L^3_s \qquad \text{(VII)}$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$. Preferably, a, b and c are each independently 1, 2 or 3. More preferably, each of $L^1$, $L^2$ and $L^3$ is a bidentate ligand (i.e. each of a, b and c are 2).

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (VIII):

(VIII)

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and Ar⁶ is a single ring or fused aromatic, for example phenyl or naphthyl.

Examples of bidentate ligands are illustrated below:

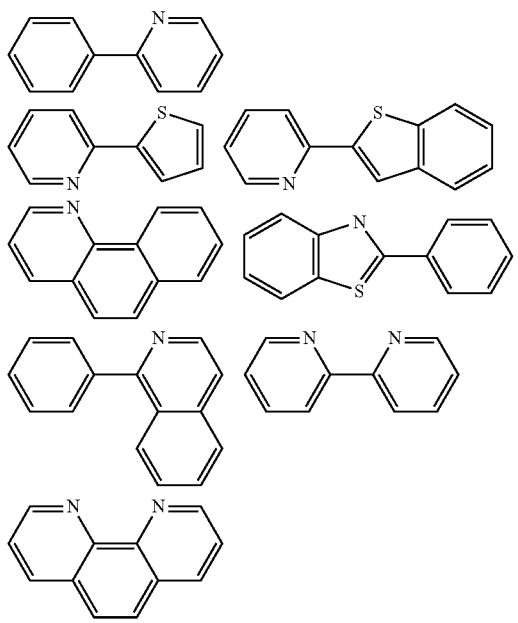

Other ligands suitable for use with d-block elements include diketonates, in particular acetylacetonate (acac); triarylphosphines and pyridine, each of which may be substituted.

Each of Ar⁵ and Ar⁶ may carry one or more substituents. Two or more of these substituents may be linked to form a ring, for example an aromatic ring.

Exemplary substituents of ligands of formula (VIII) include groups $R^1$ as described above with reference to Formula (III), preferably $C_{1-40}$ hydrocarbyl. Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; carbazole which may be used to assist hole transport to the complex when used as an emissive material, for example as disclosed in WO 02/81448; and dendrons which may be used to obtain or enhance solution processability of the metal complex, for example as disclosed in WO 02/66552.

A light-emitting dendrimer comprises a light-emitting core, such as a metal complex of formula (VII), bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy. A dendron may have optionally substituted formula (IX)

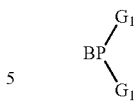

(IX)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (IXa):

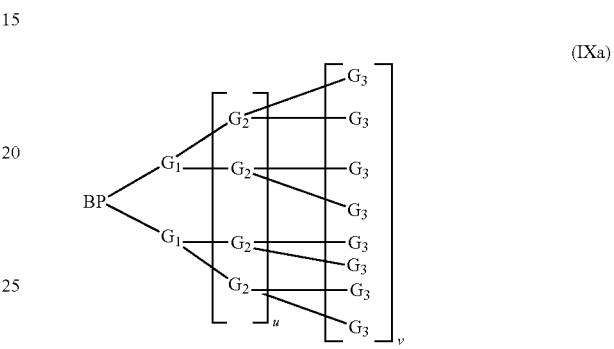

(IXa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups.

In one preferred embodiment, each of BP and $G_1$, $G_2$ . . . $G_n$ is phenyl, and each phenyl BP, $G_1$, $G_2$ . . . $G_{n-1}$ is a 3,5-linked phenyl.

A preferred dendron is a substituted or unsubstituted dendron of formula (IXb):

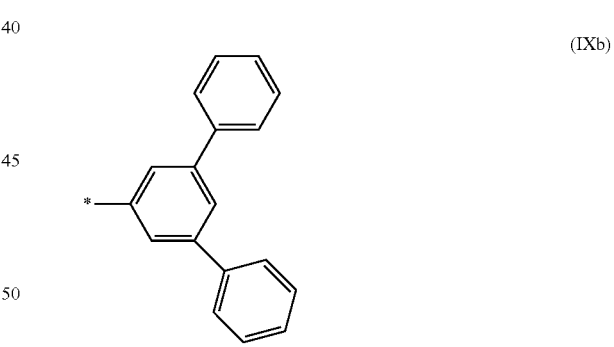

(IXb)

wherein * represents an attachment point of the dendron to a core.

BP and/or any group G may be substituted with one or more substituents, for example one or more $C_{1-20}$ alkyl or alkoxy groups.

Phosphorescent light-emitting materials of a light-emitting composition may be present in an amount of about 0.05 mol % up to about 20 mol %, optionally about 0.1-10 mol % relative to their host material. A light-emitting composition may contain one or more phosphorescent light-emitting materials.

A phosphorescent material be physically mixed with the polymer described herein or may be covalently bound to the polymer. In the case of a polymeric light-emitting host, the phosphorescent material may be provided in a side-chain, main chain or end-group of the polymer. Where a phosphorescent material is provided in a polymer side-chain, the phosphorescent material may be directly bound to the backbone of the polymer or spaced apart therefrom by a spacer group, for example a $C_{1-20}$ alkyl spacer group in which one or more non-adjacent C atoms may be replaced by O or S or —C(=O)O—. Where a phosphorescent material is provided in the backbone of the polymer it may be formed by reaction of a monomer of formula LG-RU²-LG wherein R2 is a phosphorescent metal complex as described herein. A phosphorescent metal complex may be functionalized to for reaction as a monomer in a metal-catalysed polymerisation as disclosed in EP1245659, the contents of which are incorporated herein by reference.

White Light Emission

In the case of a white light-emitting LEC or composition, the light emitted may have CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-4500K.

Formulations

An ink formulation suitable for forming a light-emitting layer may be formulated by mixing the components of the composition to form the light-emitting layer with one or more suitable solvents.

Optionally, more than one solvent is used wherein the light-emitting polymer is soluble in at least one of the solvents and wherein the polymer electrolyte is soluble in at least one of the other solvents.

Solvents suitable for dissolving polymers as described herein, particularly polymers comprising alkyl substituents, include benzenes substituted with one or more $C_{1-10}$ alkyl or $C_{1-10}$ alkoxy groups, for example toluene, xylenes and methylanisoles.

Solvents suitable for dissolving polymer electrolytes, for example PEO, include benzenes substituted with polar groups, for example electron-withdrawing groups, such as groups with a positive Hammett constant. Suitable polar groups include chlorine, cyano, $C_{1-10}$ alkoxy and benzoate substituents. Exemplary solvents include chlorobenzene. The formulation may be a solution in which all components of the composition are dissolved in the solvent or solvents, or it may be a dispersion wherein one or more components of the composition are suspended in the formulation. Preferably, the formulation is a solution. The formulation may contain further components such as surfactants and/or compatibilizers. Suitable compatibilizers include polymers comprising dialkylsiloxane repeat units, for example a dimethylsiloxane-ethylene oxide copolymer.

Deposition Methods

Ink formulations as described above may be deposited by a wide variety of coating and printing methods known to the skilled person including, without limitation, spin-coating, dip-coating, bar-coating, doctor blade coating, screen printing, gravure printing, inkjet printing, nozzle printing, flexographic printing and slot die coating.

Nozzle printing, flexographic printing, gravure printing and screen printing are preferred methods. In the method of nozzle printing onto a surface, the ink formulation may be ejected from a nozzle in a continuous stream (as opposed to ejection of individual droplets of the ink formulation). The ink dispensed in a nozzle printing process may be in simultaneous contact with both the nozzle tip and the deposition surface. Nozzle printing may produce lines of printed ink formulation that dries into corresponding lines of light-emitting films, or adjacent lines may coalesce to form a single film whilst still fluid.

Preferably, no structures for containment of the formulation are provided on the surface that the formulation is deposited onto, such as a photoresist defining wells, channels or other structures for containment of the formulation.

Following deposition, solvent may be allowed to evaporate from the formulation at ambient pressure and temperature or may be heated and/or placed under vacuum.

Hole Injection Layers

A conductive hole injection layer, which may be formed from a conductive organic or inorganic material, may be provided between the anode and the light-emitting layer of an LEC to improve hole injection from the anode into the light-emitting layer. Examples of doped organic hole injection materials include optionally substituted, doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Cathode

The cathode may consist of a single material such as a layer of aluminium or silver. Alternatively, it may comprise a plurality of layers, for example a bilayer of metals such as calcium and aluminium as disclosed in WO 98/10621, or elemental barium, either alone or with one or more cathode layers, for example a bilayer of barium and aluminium as disclosed in WO 98/57381, Appl. Phys. Lett. 2002, 81(4), 634 and WO 02/84759. The cathode may contain a thin layer (e.g. of about 0.5-5 nm) of metal compound, in particular an oxide or fluoride of an alkali or alkali earth metal between the light-emitting layer and one or more conductive layers (e.g. one or more metal layers) to assist electron injection, for example lithium fluoride as disclosed in WO 00/48258; barium fluoride as disclosed in Appl. Phys. Lett. 2001, 79(5), 2001; and barium oxide.

The cathode may be in direct contact with the light-emitting layer.

The cathode may be an air-stable conductive material, for example a metal, optionally aluminium or silver. The cathode may be deposited by evaporation or sputtering, or by deposition of a paste of the metal. A paste of the metal may be deposited by a printing method, for example screen printing.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any residual moisture or any atmospheric moisture and/or oxygen that may permeate through the substrate or encapsulant may be disposed between the substrate and the encapsulant.

Example

A precursor polymer was prepared by Suzuki polymerisation as described in WO 00/53656 of the following monomers:

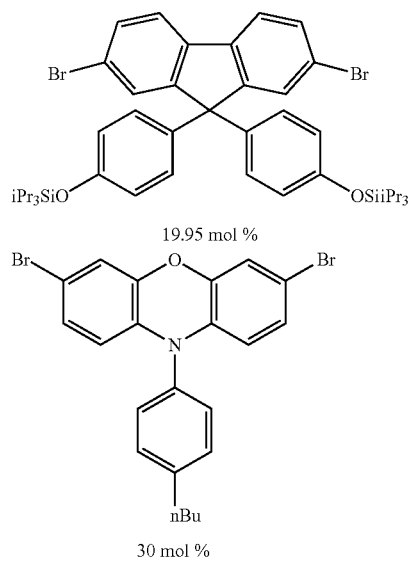

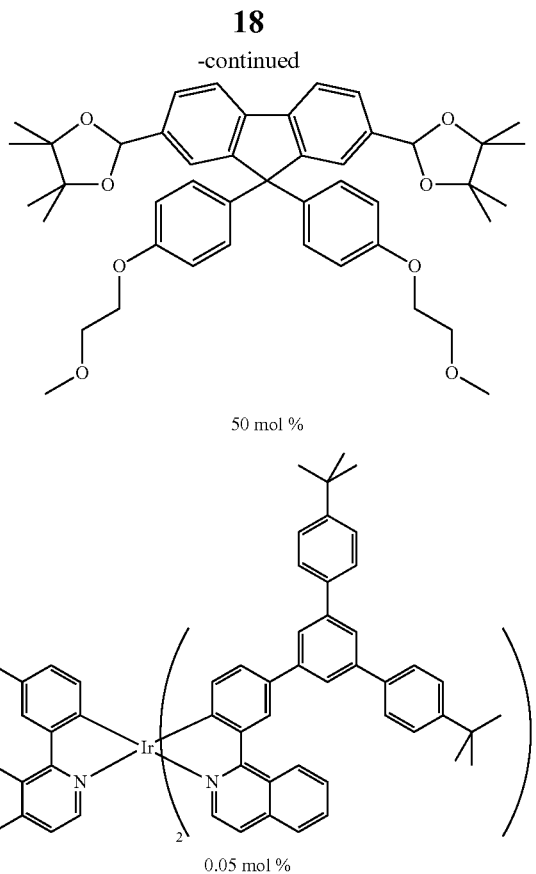

A process of forming a polymer according to the present invention is shown in the reaction scheme below. A monomer is substituted with one or more precursor groups ($OSi^iPr_3$ is shown). The monomer undergoes polymerisation, with the monomers shown above, to form a precursor polymer. The precursor group in the precursor polymer is deprotected using tetra-n-butylammonium fluoride (TBAF) to provide the deprotected phenol groups. The deprotected phenol groups are converted into PEG side-groups, using PEG tosylate, to provide the polymer.

The polymer comprises blue-emitting monomer repeat units and red-emitting end capping units; the resulting polymer is white-light emitting.

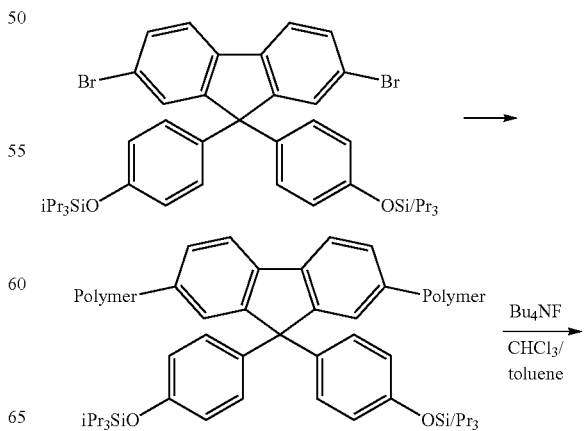

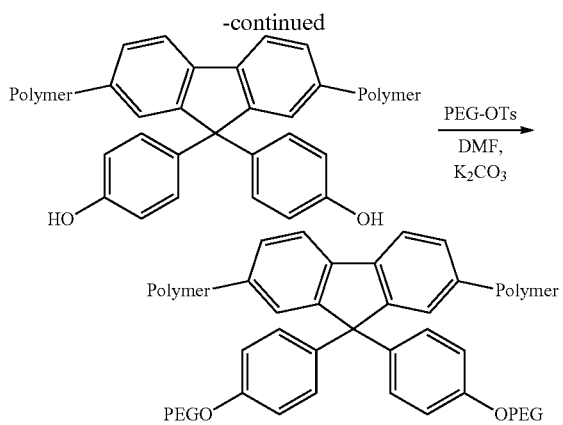

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A method of forming a polymer comprising a conjugated backbone and side-groups pendant from the conjugated backbone wherein the method comprises the steps of:
polymerising one or more monomers to form a precursor polymer comprising the conjugated backbone and precursor groups pendant from the conjugated backbone, and
converting the precursor groups to the side-groups;
wherein the backbone comprises fluorene repeat units.

2. A method of forming a polymer comprising a conjugated backbone and side-groups pendant from the conjugated backbone wherein the method comprises the steps of:
polymerising one or more monomers to form a precursor polymer comprising the conjugated backbone and precursor groups pendant from the conjugated backbone, and
converting the precursor groups to the side-groups;
wherein the side group is a group of formula —(OR)$_n$—R$^4$; wherein R in each occurrence is a C$_{1-10}$ alkyl group; wherein one or more non-adjacent C atoms may be replaced with O; R$^4$ is H or OH, and n is at least 1.

3. A method of forming a polymer comprising a conjugated backbone and side-groups pendant from the conjugated backbone wherein the method comprises the steps of:
polymerising one or more monomers to form a precursor polymer comprising the conjugated backbone and precursor groups pendant from the conjugated backbone, and
converting the precursor groups to the side-groups;
wherein the side-group is an oligomer.

4. A method of forming a polymer comprising a conjugated backbone and side-groups pendant from the conjugated backbone wherein the method comprises the steps of:
polymerising one or more monomers to form a precursor polymer comprising the conjugated backbone and precursor groups pendant from the conjugated backbone, and
converting the precursor groups to the side-groups;
wherein the precursor group is a group of formula —O-PROT, wherein PROT is a protecting group.

5. The method according to claim 2, wherein the backbone comprises arylene or heteroarylene repeat units.

6. The method according to claim 5, wherein the backbone comprises fluorene repeat units.

7. The method according to claim 1, wherein the side group is a group of formula —(OR)$_n$—R$^4$; wherein R in each occurrence is a C$_{1-10}$ alkyl group; wherein one or more non-adjacent C atoms may be replaced with O; R$^4$ is H or OH, and n is at least 1.

8. The method according to claim 1, wherein the side-group is an oligomer.

9. The method according to claim 1, wherein the precursor group is a group of formula —O-PROT wherein PROT is a protecting group.

10. The method according to claim 9, wherein PROT is a silyl group.

11. The method according to claim 1, wherein the precursor polymer further comprises side-groups that do not change during conversion of the precursor groups.

12. The method according to claim 1, wherein the polymerisation is a metal-catalysed polymerisation and the one or more monomers comprise a monomer of formula (I):

LG-RU$^1$-LG     (I)

wherein RU$^1$ is a group comprising one or more aromatic or heteroaromatic groups; each LG is a leaving group bound to an aromatic carbon atom of RU$^1$; and RU$^1$ is substituted with one or more precursor groups.

13. The method according to claim 12, wherein RU$^1$ is further substituted with one or more substituents that do not change during conversion of the precursor groups.

14. The method according to claim 12, wherein the one or more monomers comprise a monomer of formula (II):

LG-RU$^2$-LG     (II)

wherein RU$^2$ is a group comprising one or more aromatic or heteroaromatic groups; each LG is a leaving group bound to an aromatic carbon atom of RU$^2$; and RU$^2$ is unsubstituted or substituted with one or more substituents.

15. The method according to claim 12, wherein LG in each occurrence is independently selected from boronic acid, boronic acid ester and halogen.

16. The method according to claim 15, wherein the halogen is bromine or iodine.

* * * * *